United States Patent
Gaillard et al.

(10) Patent No.: US 6,531,398 B1
(45) Date of Patent: Mar. 11, 2003

(54) METHOD OF DEPOSITING ORGANOSILLICATE LAYERS

(75) Inventors: Frederic Gaillard, Meylan (FR); Li-Qun Xia, Santa Clara, CA (US); Ellie Yieh, San Jose, CA (US); Paul Fisher, Los Altos, CA (US); Srinivas D. Nemani, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/702,600

(22) Filed: Oct. 30, 2000

(51) Int. Cl.⁷ ............................................. H01L 21/00
(52) U.S. Cl. ................. 438/692; 427/489; 438/723; 438/745; 438/780; 438/781; 438/789
(58) Field of Search ............................. 438/692, 723, 438/743, 745, 756, 780, 781, 789; 427/489, 492, 497, 503, 509, 515, 577, 578, 579, 249.15, 255.37, 255.6

(56) References Cited

U.S. PATENT DOCUMENTS

| | | | | |
|---|---|---|---|---|
| 4,634,601 | A | 1/1987 | Hamakawa et al. | 427/39 |
| 4,894,352 | A | 1/1990 | Lane et al. | 437/238 |
| 5,186,718 | A | 2/1993 | Tepman et al. | 29/25.01 |
| 5,298,587 | A | 3/1994 | Hu et al. | 528/10 |
| 5,593,741 | A | 1/1997 | Ikeda | 427/579 |
| 5,598,027 | A | 1/1997 | Matsura | 257/635 |
| 5,599,740 | A | 2/1997 | Jang et al. | 437/190 |
| 5,616,369 | A | 4/1997 | Williams et al. | 427/536 |
| 5,618,619 | A | 4/1997 | Petrmichl et al. | 428/334 |

(List continued on next page.)

FOREIGN PATENT DOCUMENTS

| | | |
|---|---|---|
| DE | 196 54 737 A1 | 7/1997 |
| DE | 198 04 375 A1 | 1/1999 |
| DE | 199 04 311 A1 | 8/1999 |
| EP | 0 771 886 A1 | 5/1997 |
| EP | 0 774 533 A1 | 5/1997 |
| EP | 0 826 791 A2 | 3/1998 |
| EP | 0 840 365 A2 | 5/1998 |
| EP | 0 849 789 A2 | 6/1998 |
| EP | 0 826 791 A3 | 8/1998 |

(List continued on next page.)

OTHER PUBLICATIONS

"Low Dielectric Constant Carbon Containing SiO2 Films Deposited by PECVD Technique Using a Novel CVD Precursor" Feb. 10–11, 1997 DUMIC Conference, 1997 ISMIC—222D/97/0019, p. 19–25.

"Reactivity of Alkylsilanes and Alkylcarbosilanes in Atomic Hydrogen–Induced Chemical Vapor Deposition " by A.M. Wrobel, et al. Polish Academy of Sciences, Centre of Molecular and Macromolecular Studies, 90–363 Lodz, Poland, p. 1060–1065.

"Diamondlike Carbon Materials as Low–k Dielectrics" by A. Grill, et al. 1997 Materials Research Society, p. 417–423.

"Dielectric Material Integration for Microelectrics" by W. D. Brown from Dielectric Science and Technolgoy and Electronics Divisions Proceedings vol. 98–3, 8 pages.

"A Comparative Study of Sub–Micro Gap Filling and Planarization Techniques" by A. Hass Barllan, et al. Tower Semiconductor Ltd. Israel, SPIE vol. 2636, p. 277–288.

(List continued on next page.)

*Primary Examiner*—William A. Powell
(74) *Attorney, Agent, or Firm*—Moser, Patterson & Sheridan

(57) ABSTRACT

A method of forming an organosilicate layer is disclosed. The organosilicate layer is formed by applying an electric field to a gas mixture comprising an organosilane compound and an oxygen-containing gas. The organosilicate layer is compatible with integrated circuit fabrication processes. In one integrated circuit fabrication process, the organosilicate layer is used as an intermetal dielectric layer. In another integrated circuit fabrication process, the organosilicate layer is incorporated into a damascene structure.

83 Claims, 5 Drawing Sheets

U.S. PATENT DOCUMENTS

| | | | |
|---|---|---|---|
| 5,637,351 A | 6/1997 | O'Neal et al. | 427/255.3 |
| 5,638,251 A | 6/1997 | Goel et al. | 361/313 |
| 5,679,413 A | 10/1997 | Petrmichl et al. | 427/534 |
| 5,683,940 A | 11/1997 | Yahiro | 437/195 |
| 5,693,563 A | 12/1997 | Teong | 437/190 |
| 5,700,720 A | 12/1997 | Hashimoto | 437/195 |
| 5,703,404 A | 12/1997 | Matsuura | 257/758 |
| 5,739,579 A | 4/1998 | Chiang et al. | 257/635 |
| 5,753,564 A | 5/1998 | Fukada | 437/238 |
| 5,789,319 A | 8/1998 | Havemann et al. | 438/668 |
| 5,800,877 A | 9/1998 | Maeda et al. | 427/535 |
| 5,807,785 A | 9/1998 | Ravi | 438/624 |
| 5,821,168 A | 10/1998 | Jain | 438/692 |
| 5,834,162 A | 11/1998 | Malba | 430/317 |
| 5,858,880 A | 1/1999 | Dobson et al. | 438/758 |
| 5,874,367 A | 2/1999 | Dobson | 438/787 |
| 5,888,593 A | 3/1999 | Petrmichl et al. | 427/563 |
| 5,891,799 A | 4/1999 | Tsui | 438/624 |
| 5,989,998 A | 11/1999 | Sugahara et al. | 438/623 |
| 6,037,274 A | 3/2000 | Kudo et al. | 438/778 |
| 6,051,321 A | 4/2000 | Lee et al. | 428/447 |
| 6,054,206 A | 4/2000 | Mountsier | 428/312.8 |
| 6,054,379 A | 4/2000 | Yau et al. | 438/623 |
| 6,060,132 A | 5/2000 | Lee | 427/579 |
| 6,068,884 A | 5/2000 | Rose et al. | 427/255.6 |
| 6,072,227 A | 6/2000 | Yau et al. | 257/642 |
| 6,080,526 A | 6/2000 | Yang et al. | 430/296 |
| 6,124,641 A | 9/2000 | Matsuura | 257/759 |
| 6,140,226 A | 10/2000 | Grill et al. | 438/637 |
| 6,147,009 A | 11/2000 | Grill et al. | 438/780 |
| 6,159,871 A | 12/2000 | Loboda et al. | 438/786 |
| 6,176,198 B1 | 1/2001 | Kao et al. | 118/723 ME |
| 6,238,751 B1 | 5/2001 | Mountsier | 427/574 |
| 6,245,690 B1 | 6/2001 | Yau et al. | 438/780 |
| 6,258,735 B1 | 7/2001 | Xia et al. | 438/788 |
| 6,287,990 B1 | 9/2001 | Cheung et al. | 438/780 |
| 6,303,523 B2 * | 10/2001 | Cheung et al. | 427/489 X |
| 6,312,793 B1 | 11/2001 | Grill et al. | 428/312.6 |
| 6,316,063 B1 | 11/2001 | Andideh et al. | 427/577 |
| 6,340,435 B1 | 1/2002 | Bjorkman et al. | 216/72 |
| 6,340,628 B1 | 1/2002 | Van Cleemput et al. | 438/586 |
| 6,348,421 B1 | 2/2002 | Shu et al. | 438/788 |
| 6,348,725 B2 | 2/2002 | Cheung et al. | 257/642 |
| 6,368,924 B1 | 4/2002 | Mancini et al. | 438/286 |
| 6,383,955 B1 | 5/2002 | Matsuki et al. | 438/790 |
| 6,410,462 B1 | 6/2002 | Yang et al. | 438/788 |
| 6,410,463 B1 | 6/2002 | Matsuki | 438/790 |
| 6,413,583 B1 | 7/2002 | Moghadam et al. | 427/249.15 |
| 6,432,846 B1 | 8/2002 | Matsuki | 438/790 |
| 6,437,443 B1 | 8/2002 | Grill et al. | 257/758 |
| 6,441,491 B1 | 8/2002 | Grill et al. | 257/759 |
| 6,448,176 B1 | 9/2002 | Grill et al. | 438/758 |
| 6,448,186 B1 | 9/2002 | Olson et al. | 438/758 |
| 2001/0004479 A1 | 6/2001 | Cheung et al. | 427/553 |
| 2001/0005546 A1 | 6/2001 | Cheung et al. | 428/210 |
| 2001/0021590 A1 | 9/2001 | Matsuki | 438/780 |
| 2001/0055672 A1 | 12/2001 | Todd | 428/212 |
| 2002/0068458 A1 | 6/2002 | Chiang et al. | 438/694 |
| 2002/0098714 A1 | 7/2002 | Grill et al. | 438/778 |

FOREIGN PATENT DOCUMENTS

| | | |
|---|---|---|
| EP | 0 885 983 A1 | 12/1998 |
| EP | 0 926 715 A2 | 6/1999 |
| EP | 0 926 724 A2 | 6/1999 |
| EP | 0 935 283 A2 | 8/1999 |
| EP | 0 960 958 A2 | 12/1999 |
| EP | 1 037 275 A1 | 9/2000 |
| EP | 1 123 991 A2 | 8/2001 |
| GB | 2316 535 A | 2/1998 |
| JP | 9-8031 | 1/1997 |
| JP | 9-251997 | 2/1997 |
| JP | 9-64029 | 3/1997 |
| JP | 9-237785 | 9/1997 |
| JP | 9-260369 | 10/1997 |
| JP | 10-242143 | 9/1998 |
| JP | 11-25193 | 9/1999 |
| WO | WO 98/08249 | 2/1998 |
| WO | WO 98/59089 | 12/1998 |
| WO | WO 99/38202 | 7/1999 |
| WO | WO 99/41423 | 8/1999 |
| WO | WO 99/55526 | 11/1999 |
| WO | WO 00/01012 | 1/2000 |
| WO | WO 00/24050 | 4/2000 |
| WO | WO 01/01472 A1 | 1/2001 |
| WO | WO 02/43119 A2 | 5/2002 |

OTHER PUBLICATIONS

"Characterization of High Density Plasma Chemical Vapor Deposited a–Carbon and a–Fluorinated Carbon Films for Ultra Low Dielectric Application" by Stuardo Robles, et al. Feb. 10–11, 1997 DUMIC Conference 1997 ISMIC–222D/97/0026, p. 26–33.

"Environmental, Safety, and Health Issues in IC Production" by Rafael Reif, et al. Materials Research Society Symposium Proceedings vol. 447 Dec. 4–5, 1996, Boston, Mass. 6 pages.

"Deposition of Low–k Dielectric Films Using Trimethylsilane" by M.J. Lodoa, et al. Electrochemical Society Proceedings vol. 98–6, p. 145–152.

"Silicon Nitride and Silicon Dioxide Thin Insulating Films" by M. Jamal Deen, et al. Dielectric Science and Technology and Electronics Divisions Proceedings vol. 97–10, p. 443–453.

"Low Dielectric Constant Oxide Films Deposited Using CVD Techniques" by S. McClatchie Feb. 16–17, 1998 DUMIC Conference 1998 IMIC—333D/98/0311 p. 311–318.

"Plasma Polymerization of Trimethylsilane in Cascade Arc Discharge" by Y.S. Lin, et al. Department of Chemical Engineering, and Center for Surface Science and Plasma Technology, University of Missouri–Columbia, Received Jan. 15, 1997; accepted Feb. 4, 1997, p. 1653–1665.

"Parylene Copolymers" by K.J. Taylor, et al, SPDC, Texas Instruments, Inc., P.O. Box 3701, Dallas, TX 75265, 1997, pp. 1–9.

"Pursuing the Perfect Low–K Dielectric" by Laura Peters, 64 Semiconductor International, Sep. 1998, 7 pages.

"Low Dielectric Constant Films Prepared by Plasma–enhanced Chemical Vapor Deposition From Tetramethylsilane" by A. Grill and V. Patel, IBM–Research Division, T.J. Watson Research Center, Yorktown Heights, New York 10598, p. 3314–3318.

"Novel Low–K Dielectrics Based on Diamondlike Carbon Materials", by A. Grill, V. Patel and C. Jahnes, IBM, Research Division, T.J. Watson Research Center, Yorktown Heights, New York 10598, USA, p. 1649–1653.

"Characterization of Alternative Chemistries for Depositing PECVD Silicon Dioxide Films" by V. Hazari, et al., Novellus Systems, Inc., San Jose, CA, Feb. 16–17, 1998, pp. 319–326.

"Integration of Low Dielectric Constant Materials In Advanced Aluminum and Copper Interconnects" by Bin Zhao and Maureen Brongo, Conexant Systems, 4311 Jamboree Road, Newport Beach, CA 92660, 1999, p. 485–497.

"Low Dielectric Constant Insulator Formed by Downstream Plasma CVD at Room Temperature Using TMS/$O_2$", Akiko Narea and Hitoshi Itoh, ULSI Research Lab, accepted Nov. 14, 1996, p. 1477–1480.

EP Communication, Aug. 24, 2001.

EP Communication, Feb. 22, 2002.

* cited by examiner

METHOD OF DEPOSITING ORGANOSILLICATE LAYERS

BACKGROUND OF THE DISCLOSURE

1. Field of the Invention

The present invention relates to organosilicate layers, their use in integrated circuit fabrication, and a method for forming an organosilicate layer.

2. Description of the Background Art

Integrated circuits have evolved into complex devices that can include millions of components (e.g., transistors, capacitors and resistors) on a single chip. The evolution of chip designs continually requires faster circuitry and greater circuit density. The demands for greater circuit density necessitate a reduction in the dimensions of the integrated circuit components.

As the dimensions of the integrated circuit components are reduced (e.g., sub-micron dimensions), the materials used to fabricate such components contribute to their electrical performance. For example, low resistivity metal interconnects (e.g., copper and aluminum) provide conductive paths between the components on integrated circuits. Typically, the metal interconnects are electrically isolated from each other by an insulating material. When the distance between adjacent metal interconnects and/or the thickness of the insulating material has sub-micron dimensions, capacitive coupling potentially occurs between such interconnects. Capacitive coupling between adjacent metal interconnects may cause cross talk and/or resistance-capacitance (RC) delay which degrades the overall performance of the integrated circuit. In order to prevent capacitive coupling between adjacent metal interconnects, low dielectric constant (low k) insulating materials (e.g., dielectric constants less than about 4.5) are needed.

Therefore, a need exists in the art for low dielectric constant materials suitable for integrated circuit fabrication.

SUMMARY OF THE INVENTION

A method of forming an organosilicate layer for use in integrated circuit fabrication is provided. In one embodiment, the organosilicate layer is formed by applying an electric field to a gas mixture comprising an organosilane compound and an oxygen-containing gas.

The organosilicate layer is compatible with integrated circuit fabrication processes. In one integrated circuit fabrication sequence, the organosilicate layer is used as an intermetal dielectric layer. For such an embodiment, a preferred process sequence includes depositing the organosilicate layer over conductive features formed on a substrate.

In another integrated circuit fabrication sequence, the organosilicate layer is incorporated into a damascene structure. For such an embodiment, a preferred process sequence includes depositing a first dielectric layer on a substrate. An organosilicate layer is then formed on the first dielectric layer. Thereafter, the organosilicate layer is patterned and etched to define contacts/vias therethrough. After the organosilicate layer is patterned and etched, a second dielectric layer is deposited thereover. The second dielectric layer is then patterned and etched to define interconnects therethrough. The interconnects formed in the second dielectric layer are positioned over the contacts/vias formed in the organosilicate layer. After the interconnects are formed, the contacts/vias defined in the organosilicate layer are etched through the first dielectric layer to the substrate surface. Thereafter, the damascene structure is completed by filling the interconnects and contacts/vias with a conductive material.

BRIEF DESCRIPTION OF THE DRAWINGS

The teachings of the present invention can be readily understood by considering the following detailed description in conjunction with the accompanying drawings, in which.

DETAILED DESCRIPTION

Figure 1:
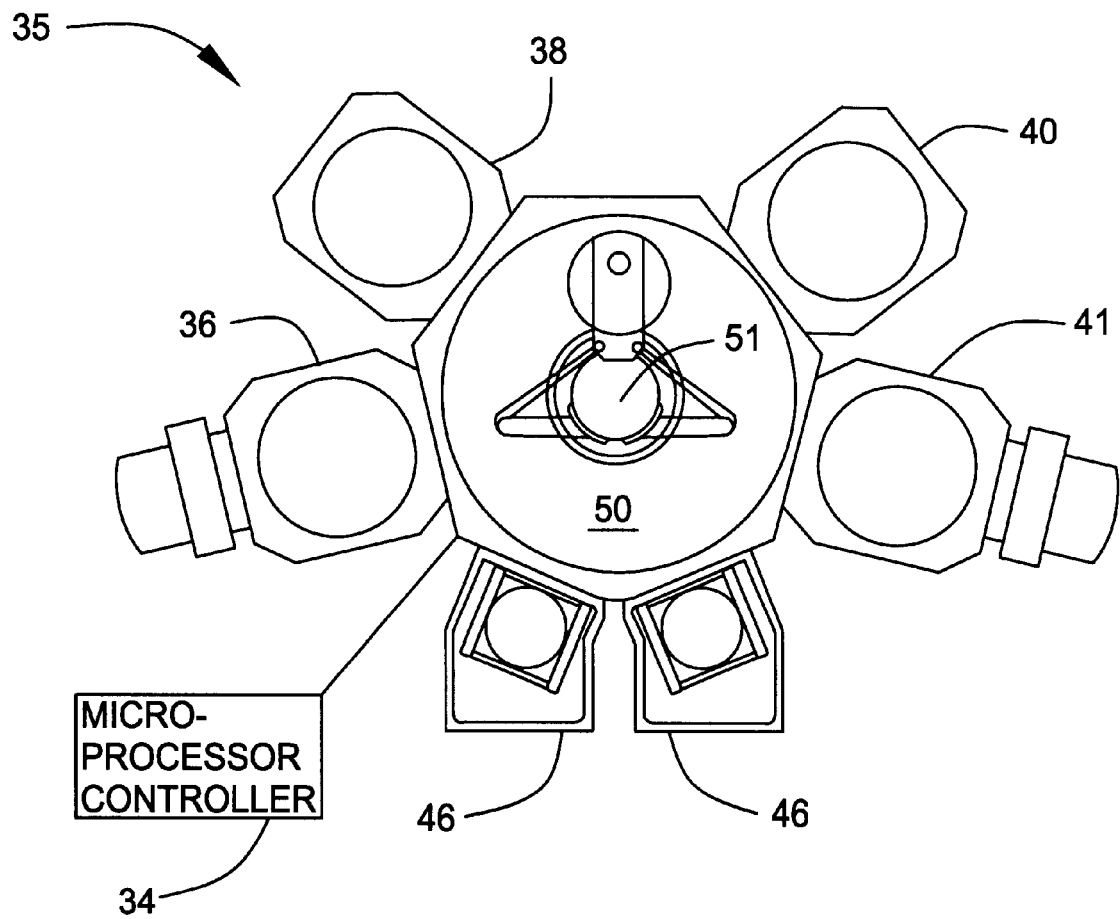
FIG. 1 depicts a schematic illustration of an apparatus that can be used for the practice of embodiments described herein.

FIG. 1 is a schematic representation of a wafer processing system 35 that can be used to perform integrated circuit fabrication in accordance with embodiments described herein. This apparatus typically comprises process chambers 36, 38, 40, 41, load-lock chambers 46, a transfer chamber 50, a microprocessor controller 54, along with other hardware components such as power supplies (not shown) and vacuum pumps (not shown). An example of such a wafer processing system 35 is a CENTURA® System, commercially available from Applied Materials, Inc., Santa Clara, Calif.

Details of the wafer processing system are described in commonly assigned U.S. Pat. No. 5,186,718, entitled, "Staged-Vacuum Substrate Processing System and Method", issued on Feb. 16, 1993, and is hereby incorporated by reference. The salient features of this system 35 are briefly described below.

The wafer processing system 35 includes a transfer chamber 50, containing a transfer robot 51. The transfer chamber 50 is coupled to load-lock chambers 46 as well as a cluster of process chambers 36, 38, 40, 41.

Substrates (not shown) are loaded into the wafer processing system 35 through load-lock chambers 46. Thereafter, transfer robot 51 moves the substrates between one or more of the process chambers 36, 38, 40, 41.

The process chambers 36, 38, 40, 41 are used to perform various integrated circuit fabrication sequences. For example, process chambers 36, 38, 40, 41 may include physical vapor deposition (PVD) chambers, ionized metal plasma physical vapor deposition (IMP PVD) chambers, chemical vapor deposition (CVD) chambers, rapid thermal process (RTP) chambers, and anti-reflective coating (ARC) chambers, among others.

Figure 2:
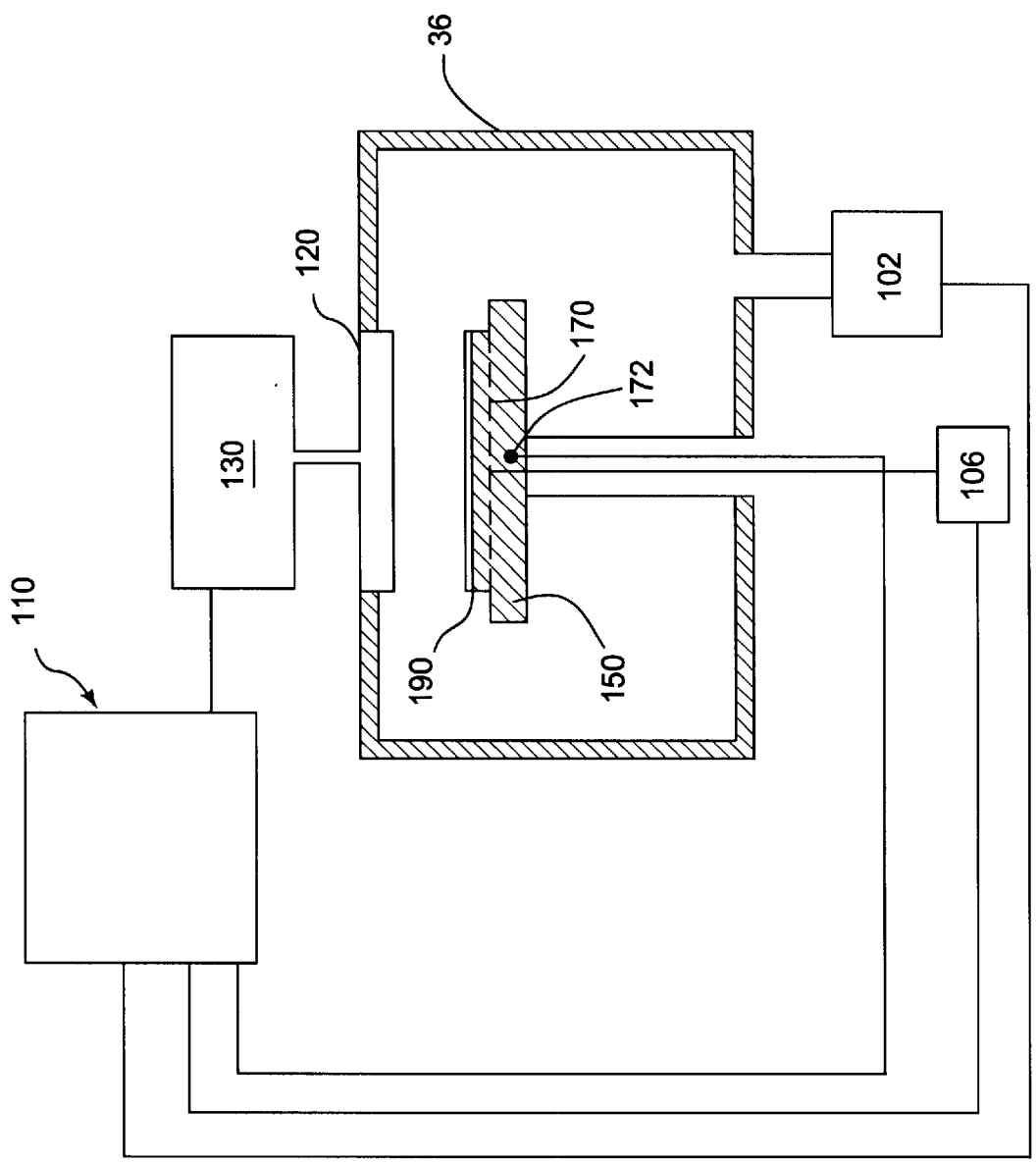
FIG. 2 depicts a schematic cross-sectional view of a chemical vapor deposition (CVD) chamber.

FIG. 2 depicts a schematic cross-sectional view of a chemical vapor deposition (CVD) process chamber 36 of wafer processing system 35. CVD process chamber 36 may be used to deposit organosilicate layers in accordance with embodiments described herein. An example of such a CVD process chamber 36 is a DXZ™ chamber, commercially available from Applied Materials, Inc., Santa Clara, Cali.

CVD process chamber 36 typically comprises a gas panel 130, a control unit 110, along with other hardware components such as power supplies and vacuum pumps. Details of a CVD process chamber 36 are described in commonly assigned U.S. patent application Ser. No. 09/211,998, entitled "High Temperature Chemical Vapor Deposition Chamber", filed on Dec. 14, 1998, the entirety of which is herein incorporated by reference. The salient features of the CVD process chamber 36 are briefly described below.

The CVD process chamber 36 generally houses a support pedestal 150, which is used to support a substrate such as a semiconductor wafer 190. This pedestal 150 can typically be moved in a vertical direction inside the chamber 36 using a displacement mechanism (not shown). Depending on the specific process, the wafer 190 can be heated to some desired temperature prior to layer deposition. For example, the wafer support pedestal 150 is heated by an embedded heater element 170. The pedestal 150 may be resistively heated by applying an electric current from an AC supply 106 to the heater element 170. The wafer 190 is, in turn, heated by the pedestal 150. A temperature sensor 172, such as a thermocouple, is also embedded in the wafer support pedestal 150 to monitor the temperature of the pedestal 150 in a conventional manner. The measured temperature is used in a feedback loop to control the power supplied to the heating element 170, such that the wafer temperature can be maintained or controlled at a desired temperature which is suitable for the particular process application. The pedestal 150 is optionally heated using a plasma or by radiant heat (not shown).

A vacuum pump 102, is used to evacuate the process chamber 36 and to maintain the proper gas flows and pressure inside the chamber 36. A showerhead 120, through which process gases are introduced into the chamber 36, is located above the wafer support pedestal 150. The showerhead 120 is connected to a gas panel 130, which controls and supplies various gases used in different steps of the process sequence.

The showerhead 120 and wafer support pedestal 150 also form a pair of spaced apart electrodes. When an electric field is generated between these electrodes, the process gases introduced into the chamber 36 are ignited into a plasma. Typically, the electric field is generated by connecting the wafer support pedestal 150 to a source of RF power (not shown) through a matching network (not shown). Alternatively, the RF power source and matching network may be coupled to the showerhead 120, or coupled to both the showerhead 120 and the wafer support pedestal 150.

Plasma enhanced chemical vapor deposition (PECVD) techniques promote excitation and/or disassociation of the reactant gases by the application of the electric field to the reaction zone near the substrate surface, creating a plasma of reactive species. The reactivity of the species in the plasma reduces the energy required for a chemical reaction to take place, in effect lowering the required temperature for such PECVD processes.

In at least one embodiment, organosilicate layer deposition is accomplished by plasma enhanced oxidation of a organosilane compound, such as, for example, trimethylsilane. The organosilane compound is introduced into the process chamber 36 under the control of gas panel 130 as a gas with a regulated flow.

Proper control and regulation of the gas flows through the gas panel 130 is performed by mass flow controllers (not shown) and a computer (not shown). The showerhead 120 allows process gases from the gas panel 130 to be uniformly introduced and distributed in the process chamber 100.

Referring to FIG. 1, the CVD process chamber 36 is controlled by a microprocessor controller 54. The microprocessor controller 54 may be one of any form of general purpose computer processor (CPU) that can be used in an industrial setting for controlling various chambers and subprocessors. The computer may include any suitable memory, such as random access memory, read only memory, floppy disk drive, hard disk, or any other form of digital storage, local or remote. Various support circuits may be coupled to the CPU for supporting the processor in a conventional manner. Software routines as required may be stored in the memory or executed by a second CPU that is remotely located.

The software routines are executed after the substrate is positioned on the pedestal. The software routine, when executed, transforms the general purpose computer into a specific process computer that controls the chamber operation so that a chamber process is performed. Alternatively, a process of the present invention may be performed in hardware, as an application specific integrated circuit or other type of hardware implementation, or a combination of software or hardware.

Organosilicate Layer Deposition

In one embodiment, the organosilicate layer is formed by applying an electric field to a gas mixture comprising an organosilane compound and an oxygen-containing gas. The organosilane compound has the general formula $Si_aC_bH_cO_d$ where a has a range between 1 and 2, b has a range between 1 and 10, c has a range between 6 and 30, and d has a range between 0 and 6.

For example, methylsilane ($SiCH_6$), dimethylsilane ($SiC_2H_8$), trimethylsilane ($SiC_3H_{10}$), tetramethylsilane ($SiC_4H_{12}$), methoxysilane ($SiCH_6O$), dimethyldimethoxysilane ($SiC_4H_{12}O_2$), diethyldiethoxysilane ($SiC_8H_{20}O_2$), dimethyldiethoxysilane ($SiC_6H_{16}O_2$), diethyldimethoxysilane ($SiC_6H_{16}O_2$), hexamethyldisiloxane ($Si_2C_6H_{18}O$), bis(methylsilano)methane ($Si_2C_3H_{12}$), 1,2-bis(methylsilano)ethane ($Si_2C_4H_{14}$), among others may be used as the organosilane compound.

Oxygen ($O_2$), ozone ($O_3$), nitrous oxide ($N_2O$), carbon monoxide (CO), carbon dioxide ($CO_2$), or combinations thereof, among others, may be used as the oxygen-containing gas. The oxidizing gas may be diluted with an inert gas such as helium (He) and/or argon (Ar).

In general, the following deposition process parameters can be used to form the organosilicate layer using a CVD process chamber similar to that shown in FIG. 2. The process parameters may include a wafer temperature of about 50° C. to about 500° C., a chamber pressure of about 1 torr to about 500 torr, an organosilane compound gas flow rate of about 50 sccm to about 1000 sccm, an oxygen-containing gas flow rate of about 10 sccm to about 1000 sccm, and an RF power of between about 1 watts/cm$^2$ to about 500 watts/cm$^2$. The above process parameters provide a deposition rate for the organosilicate layer in the range of about 0.1 micron/min to about 2 micron/min when implemented on a 200 mm (millimeter) substrate in a deposition chamber available from Applied Materials, Inc.

Other deposition chambers are within the scope of the invention, and the parameters listed above may vary according to the particular deposition chamber used to form the organosilicate layer. For example, other deposition chambers may have a larger (e.g., configured to accommodate 300 mm substrates) or smaller volume, requiring gas flow rates that are larger or smaller than those recited for deposition chambers available from Applied Materials, Inc.

After the organosilicate layer is formed, it is optionally annealed. Nitrogen ($N_2$), hydrogen ($H_2$), oxygen ($O_2$), or combinations thereof, among others, may be used as the annealing gas. It is believed that the annealing step minimizes the water vapor absorption capability of the as deposited organosilicate layer, improving the dielectric properties thereof.

In general, the following process parameters may be used to anneal the organosilicate layer in a process chamber similar to that shown in FIG. 2. The process parameters range from a wafer temperature of about 200° C. to about 500° C. and an annealing gas flow rate of about 1000 scam to about 10,000 scam. The organosilicate layer is annealed for less than about 30 minutes.

The as-deposited organosilicate layer has a dielectric constant that is less than about 3.0, making it suitable for use as an insulating material in integrated circuits. The dielectric constant of the organosilicate layer is tunable, in that it can be varied in a range between about 2.0 to about 3.0 as a function of the reaction temperature. In particular, as the reaction temperature increases, the dielectric constant of the as-deposited layer decreases.

The dielectric constant of the organosilicate layer can also be tuned as a function of the composition of the gas mixture during layer formation. As the carbon (C) concentration in the gas mixture increases, the C content of the as-deposited organosilicate layer increases, decreasing its dielectric constant.

Figure 3A:
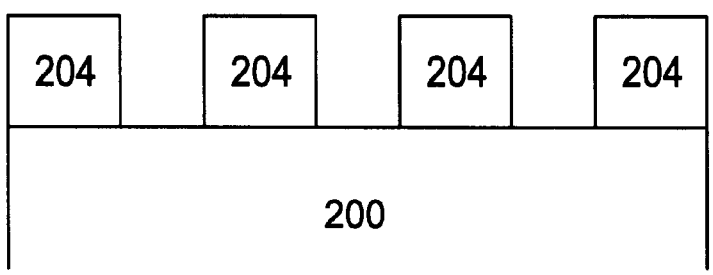
FIGS. 3a–3b depict schematic cross-sectional views of a substrate at different stages of integrated circuit fabrication incorporating an organosilicate layer as an intermetal dielectric layer.
Figure 3B:
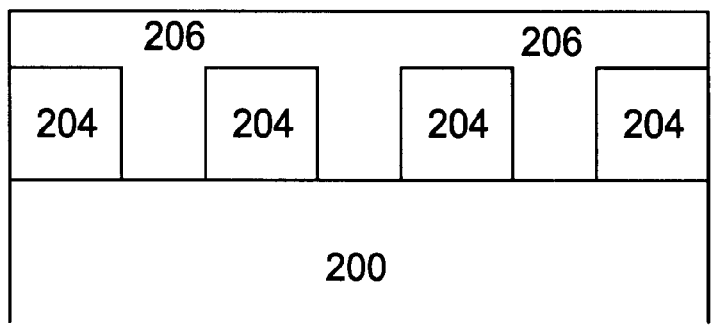

Integrated Circuit Fabrication Processes
A. Organosilicate Intermetal Dielectric Layer FIGS. 3a–3b illustrate schematic cross-sectional views of a substrate 200 at different stages of an integrated circuit fabrication sequence incorporating an organosilicate layer as an intermetal dielectric layer. In general, the substrate 200 refers to any workpiece on which film processing is performed. Depending on the specific stage of processing, the substrate 200 may correspond to a silicon wafer, or other material layers, which have been formed on the substrate. FIG. 3a, for example, illustrates a cross-sectional view of a substrate structure 250 in which the substrate 200 is a silicon wafer with conductive features 204 formed thereon. The conductive features may be formed of a metal (e.g., copper, aluminum, tungsten).

The conductive features 204 have various cross-sectional geometries such as, for example, square, rectangular, and circular. The conductive features typically have aspect ratios of greater than about 1:4. The aspect ratio is defined as the feature height divided by its width.

FIG. 3b depicts an organosilicate layer 206 formed on the substrate structure 250 according to the process parameters described above. The thickness of the organosilicate layer 206 is variable depending upon the specific stage of processing. Typically the organosilicate layer 206 is deposited to a thickness of about 500 Å to about 10000 Å.

Figure 4A:
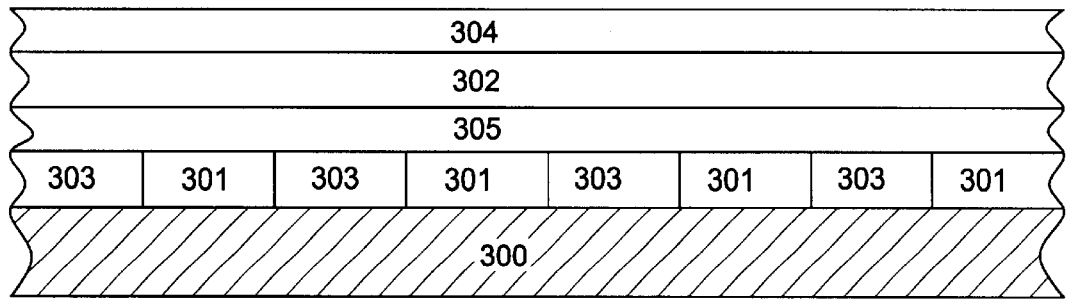
FIGS. 4a–4e depict schematic cross-sectional views of a damascene structure at different stages of integrated circuit fabrication incorporating an organosilicate layer in such structure.

After the organosilicate layer 206 is formed on the substrate structure 250, the organosilicate layer is optionally annealed. The organosilicate layer 206 is annealed according to the process parameters described above.
C. Damascene Structure Incorporating an Organosilicate Layer FIGS. 4a–4e illustrate schematic cross-sectional views of a substrate 300 at different stages of a damascene structure fabrication sequence incorporating an organosilicate layer therein. Damascene structures are typically used to form metal interconnects on integrated circuits. Depending on the specific stage of processing, substrate 300 may correspond to a silicon substrate, or other material layer that has been formed on the substrate 300. FIG. 4a, for example, illustrates a cross-sectional view of a substrate 300 having conductive features 301, intermetal dielectric 303, a barrier layer 305, as well as a first dielectric layer 302 formed thereon. The conductive features 301 may be a metal (e.g., aluminum, copper). The intermetal dielectric 303 and the barrier layer 305 may be a low dielectric constant material (e.g., organosilicate material, silicon carbide). The first dielectric layer 302 may be an oxide (e.g., silicon oxide, fluorosilicate glass). In general, the substrate 300 may include a layer of silicon, suicides, metals, or other materials.

FIG. 4a illustrates one embodiment in which the substrate 300 is silicon, the conductive features 301 are copper, and the intermetal dielectric 303 is a silicon oxide. The barrier layer 305 is typically a silicon carbide layer suitable to minimize the diffusion of metal from the conductive features into the first dielectric layer 302. The barrier layer 305 has a thickness of about 200 Å to about 1000 Å, depending on its dielectric constant as well as its etch selectivity with respect to the overlying dielectric material (e.g., the barrier layer preferably has an etch selectivity with respect to the overlying dielectric layer that is greater than about 10:1). The first dielectric layer 302 has a thickness of about 1,000 Å to about 10,000 Å, depending on the size of the structure to be fabricated.

An organosilicate layer 304 is formed on the first dielectric layer 302. The organosilicate layer 304 is formed on the first dielectric layer 302 according to the process parameters described above. The organosilicate layer 304 has a dielectric constant less than 3.0, so as to prevent or minimize capacitive coupling between the metal interconnects to be formed in the damascene structure. The dielectric constant for the organosilicate layer 304 is tunable, in that it can be varied in the desired range as a function of the reaction temperature as well as the composition of the gas mixture during layer formation.

The thickness of the organosilicate layer 304 is variable depending on the specific stage of processing. Typically, the organosilicate layer 304 has a thickness of about 200 Å to about 1000 Å, depending on its dielectric constant as well as its etch selectivity with respect to an overlying dielectric material subsequently formed thereon (e.g., the barrier layer preferably has an etch selectivity with respect to the overlying dielectric layer that is greater than about 10:1).

Figure 4B:
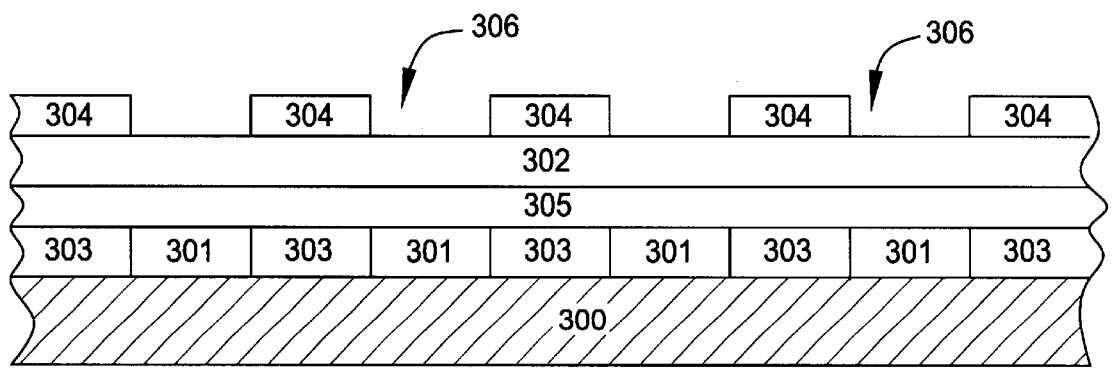

Referring to FIG. 4b, the organosilicate layer 304 is patterned and etched to define contact/via openings 306 and to expose the first dielectric layer 302, in areas where the contacts/vias are to be formed. The contact/via openings 306 are positioned over the conductive features 301.

The organosilicate layer 304 may be patterned using conventional lithography process. For example, in a conventional lithography process, a layer of energy sensitive resist material (not shown) is formed on the organosilicate layer 304. The layer of energy sensitive resist material can be spin coated on the substrate to a thickness within a range of about 4000 Å to about 10,000 Å. Most energy sensitive resist materials are sensitive to ultraviolet (UV) radiation having a wavelength less than about 450 nm (nanometers). Deep ultraviolet (DUV) resist materials are sensitive to UV radiation having wavelengths less than about 245 nm.

An image of a pattern is introduced into the layer of energy sensitive resist material by exposing such energy sensitive resist material to UV radiation via a mask (not shown). The image of the pattern introduced in the layer of the energy sensitive resist material is developed in an appropriate developer to define the pattern therethrough. Thereafter referring to FIG. 4b, the pattern defined in the energy sensitive resist material is transferred through the organosilicate layer 304.

The pattern is transferred through the organosilicate layer 304 using the energy sensitive resist material (not shown) as a mask. The pattern is transferred through the organosilicate layer 304 using an appropriate chemical etchant. For example, carbon tetrafluoride ($CF_4$) fluoroethane ($C_2F_6$), and fluorobutene ($C_4F_8$) may be used to chemically etch the organosilicate layer 304.

Figure 4C:
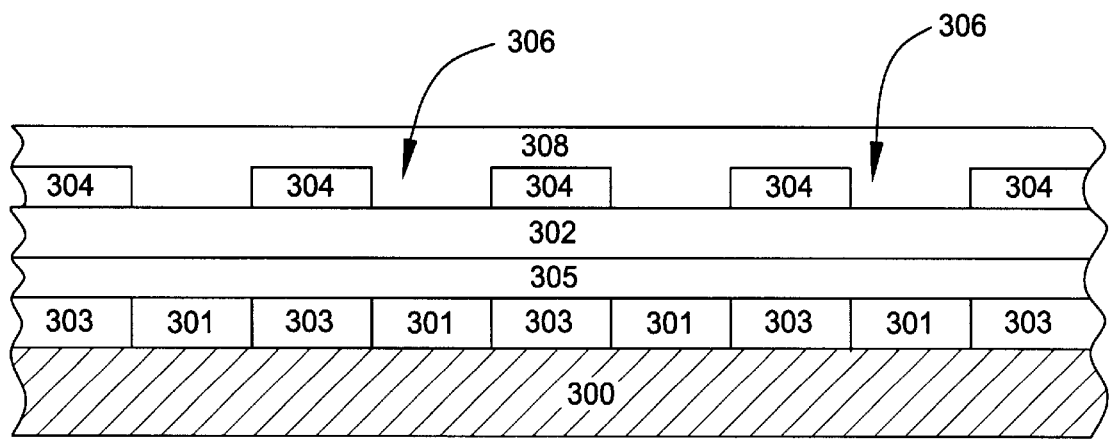

After the organosilicate layer 304 is patterned, a second dielectric layer 308 is deposited over the organosilicate layer 304, as shown in FIG. 4c. The second dielectric layer 308 may be an oxide (e.g., silicon dioxide, fluorosilicate glass). The second dielectric layer 308 has a thickness of about 1,000 Å to about 10,000 Å, depending on the size of the structure to be fabricated.

Figure 4D:
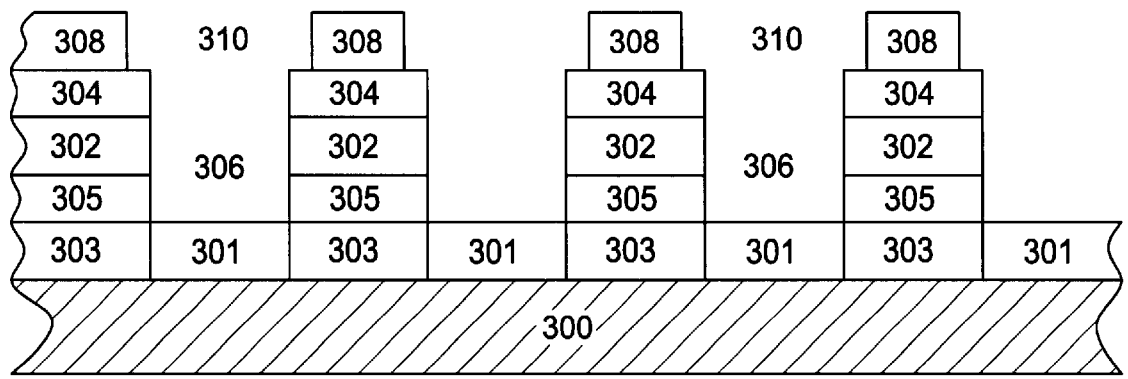

The second dielectric layer 308 is then patterned to define interconnects 310, as illustrated in FIG. 4d, preferably using conventional lithography processes as described above. The interconnects 310 formed in the second dielectric layer 308 are positioned over the contact/via openings 306 in the organosilicate layer 304. Thereafter, both the interconnects 310 and contacts/vias 306 are etched to expose the surface of the conductive features 301, using reactive ion etching or other anisotropic etching techniques.

Figure 4E:
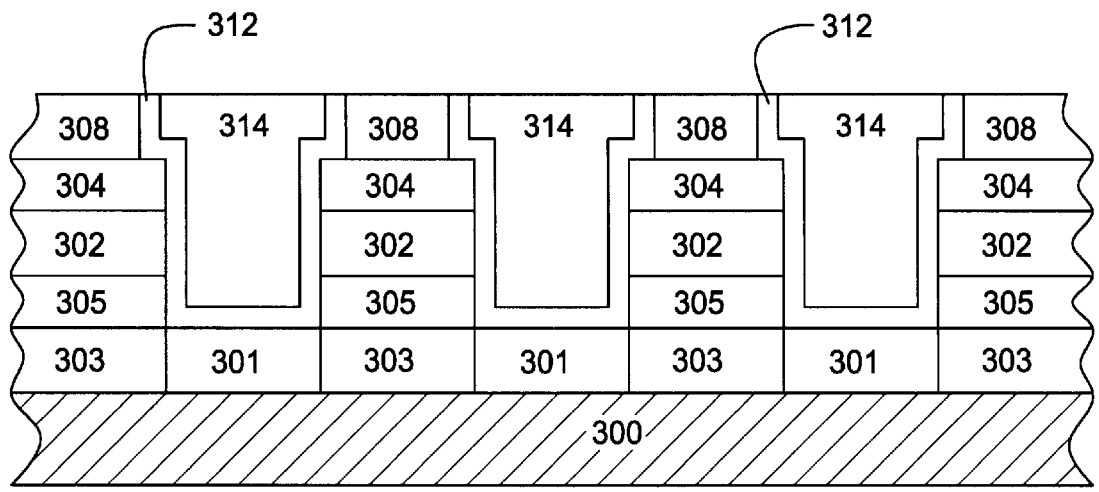

Referring to FIG. 4e, the interconnects 310 and contacts/vias 306 are filled with a conductive material 314 such as aluminum, copper, tungsten, or combinations thereof. Typically, copper is used to fill the interconnects 310 and contacts/vias 306 due to its low resistivity (resistivity about 1.7 $\mu\Omega$-cm). The conductive material 314 is deposited using chemical vapor deposition, physical vapor deposition, electroplating, or combinations thereof, to form the damascene structure. Preferably, a barrier layer 312 such as tantalum, tantalum nitride, or other suitable barrier material is first deposited conformably on the sidewalls of the interconnects 310 and contacts/vias 306 to prevent metal migration into the surrounding dielectric layers 302, 308 as well as the organosilicate layer 304.

Although several preferred embodiments, which incorporate the teachings of the present invention, have been shown and described in detail, those skilled in the art can readily devise many other varied embodiments that still incorporate these teachings.

What is claimed is:

1. A method of thin film deposition, comprising:
    positioning a substrate in a deposition chamber;
    providing a gas mixture to the deposition chamber, wherein the gas mixture comprises an organosilane compound and an oxygen-containing gas; and
    applying an electric field to the gas mixture in the deposition chamber to form an organosilicate layer on the substrate.

2. The method of claim 1 wherein the organosilane compound has a general formula $Si_aC_bH_cO_d$ where a has a range between 1 and 2, b has a range between 1 and 10, c has a range between 6 and 30, and d has a range between 0 and 6.

3. The method of claim 2 wherein the organosilane compound is selected from the group of methylsilane ($SiCH_6$), dimethylsilane ($SiC_2H_8$), trimethylsilane ($SiC_3H_{10}$), tetramethylsilane ($SiC_4H_{12}$), methoxysilane ($SiCH_6O$), dimethyldimethoxysilane ($SiC_4H_{12}O_2$), diethyldiethoxysilane ($SiC_8H_{18}O_2$), dimethyldiethoxysilane ($SiC_6H_{16}O_2$), diethyldimethoxysilane ($SiC_6H_{16}O_2$), hexamethyldisiloxane ($Si_2C_6H_{18}O$), bis(methylsilano)methane ($Si_2C_3H_{12}$), 1,2-bis (methylsilano) ethane ($Si_2C_4H_{14}$), and combinations thereof.

4. The method of claim 1 wherein the oxygen-containing gas is selected from the group of nitrous oxide ($N_2O$), oxygen ($O_2$), ozone ($O_3$) carbon monoxide (CO), carbon dioxide ($CO_2$), and combinations thereof.

5. The method of claim 1 wherein the electric field applied to the gas mixture in the deposition chamber is a radio frequency (RF) power.

6. The method of claim 5 wherein the RF power is within the range of about 1 watts/cm$^2$ to about 500 watts/cm$^2$.

7. The method of claim 1 wherein the deposition chamber is maintained at a pressure between about 1 torr to about 500 torr.

8. The method of claim 1 wherein the organosilane compound is provided to the deposition chamber at a flow rate in a range of about 50 sccm to about 1000 sccm.

9. The method of claim 1 wherein the oxygen-containing gas is provided to the deposition chamber at a flow rate in a range of about 10 sccm to about 1000 sccm.

10. The method of claim 1 wherein the ratio of the oxygen-containing gas to the organosilane compound is about 1:1 to about 1:5.

11. The method of claim 1 wherein the deposition chamber is maintained at a temperature between about 50° C. to about 500° C.

12. The method of claim 1 wherein the organosilicate layer is formed on the substrate at a rate greater than about 0.1 microns per minute.

13. The method of claim 1 further comprising the step of annealing the organosilicate layer formed on the substrate.

14. The method of claim 13 wherein the annealing step is performed at a temperature between about 200° C. to about 500° C.

15. The method of claim 13 wherein the annealing step is performed in an atmosphere comprising one or more gases selected from the group of nitrogen ($N_2$), hydrogen ($H_2$), and oxygen ($O_2$).

16. The method of claim 13 wherein the annealing step is performed for a time less than about 30 minutes.

17. A method forming an organosilicate layer on a substrate, comprising:
    positioning a substrate in a deposition chamber;
    providing a gas mixture to the deposition chamber, wherein the gas mixture comprises an organosilane compound and an oxygen-containing gas; and
    applying an electric field to the gas mixture in the deposition chamber to form an organosilicate layer on the substrate.

18. The method of claim 17 wherein the organosilane compound has a general formula $Si_aC_bH_cO_d$ where a has a range between 1 and 2, b has a range between 1 and 10, c has a range between 6 and 30, and d has a range between 0 and 6.

19. The method of claim 18 wherein the organosilane compound is selected from the group of methylsilane ($SiCH_6$), dimethylsilane ($SiC_2H_8$), trimethylsilane ($SiC_3H_{10}$), tetramethylsilane ($SiC_4H_{12}$), methoxysilane ($SiCH_6O$), dimethyldimethoxysilane ($SiC_4H_{12}O_2$), diethyldiethoxysilane ($SiC_8H_{18}O_2$), dimethyldiethoxysilane ($SiC_6H_{16}O_2$), diethyldimethoxysilane ($SiC_6H_{16}O_2$), hexamethyldisiloxane ($Si_2C_6H_{18}O$), bis(methylsilano)methane ($Si_2C_3H_{12}$), 1,2-bis(methylsilano)ethane ($Si_2C_4H_{14}$), and combinations thereof.

20. The method of claim 17 wherein the oxygen-containing gas is selected from the group of nitrous oxide ($N_2O$), oxygen ($O_2$), ozone ($O_3$), carbon monoxide (CO), carbon dioxide ($CO_2$), and combinations thereof.

21. The method of claim 17 wherein the electric field applied to the gas mixture in the deposition chamber is a radio frequency (RF) power.

22. The method of claim 21 wherein the RF power is within the range of about 1 watts/cm$^2$ to about 500 watts/cm$^2$.

23. The method of claim 17 wherein the deposition chamber is maintained at a pressure between about 1 torr to about 500 torr.

24. The method of claim 17 wherein the organosilane compound is provided to the deposition chamber at a flow rate in a range of about 50 sccm to about 1000 sccm.

25. The method of claim 17 wherein the oxygen-containing gas is provided to the deposition chamber at a flow rate in a range of about 10 sccm to about 1000 sccm.

26. The method of claim 17 wherein the ratio of the oxygen-containing gas to the organosilane compound is about 1:1 to about 1:5.

27. The method of claim 17 wherein the deposition chamber is maintained at a temperature between about 50° C. to about 500° C.

28. The method of claim 17 wherein the organosilicate layer is formed on the substrate at a rate greater than about 0.1 microns per minute.

29. The method of claim 17 further comprising the step of annealing the organosilicate layer formed on the substrate.

30. The method of claim 29 wherein the annealing step is performed at a temperature between about 200° C. to about 500° C.

31. The method of claim 29 wherein the annealing step is performed in an atmosphere comprising one or more gases selected from the group of nitrogen ($N_2$), hydrogen ($H_2$), and oxygen ($O_2$).

32. The method of claim 29 wherein the annealing step is performed for a time less than about 30 minutes.

33. A computer storage medium containing a software routine that, when executed, causes a general purpose computer to control a deposition chamber using a layer deposition method, comprising:
  positioning a substrate in a deposition chamber;
  providing a gas mixture to the deposition chamber, wherein the gas mixture comprises an organosilane compound and an oxygen-containing gas; and
  applying an electric field to the gas mixture in the deposition chamber to form an organosilicate layer on the substrate.

34. The computer storage medium of claim 33 wherein the organosilane compound has a general formula $Si_aC_bH_cO_d$ where a has a range between 1 and 2, b has a range between 1 and 10, c has a range between 6 and 30, and d has a range between 0 and 6.

35. The computer storage medium of claim 34 wherein the organosilane compound is selected from the group of methylsilane ($SiCH_6$), dimethylsilane ($SiC_2H_8$), trimethylsilane ($SiC_3H_{10}$), tetramethylsilane ($SiC_4H_{12}$), methoxysilane ($SiCH_6O$), dimethyldimethoxysilane ($SiC_4H_{12}O_2$), diethyldiethoxysilane ($SiC_8H_{18}O_2$), dimethyldiethoxysilane ($SiC_6H_{16}O_2$), diethyldimethoxysilane ($SiC_6H_{16}O_2$), hexamethyldisiloxane ($Si_2C_6H_{18}O$), bis(methylsilano)methane ($Si_2C_3H_{12}$), 1,2-bis(methylsilano)ethane ($Si_2C_4H_{14}$), and combinations thereof.

36. The computer storage medium of claim 33 wherein the oxygen-containing gas is selected from the group of nitrous oxide ($N_2O$), oxygen ($O_2$), ozone ($O_3$), carbon monoxide (CO), carbon dioxide ($CO_2$), and combinations thereof.

37. The computer storage medium of claim 33 wherein the electric field applied to the gas mixture in the deposition chamber is a radio frequency (RF) power.

38. The computer storage medium of claim 37 wherein the RF power is within the range of about 1 watts/cm$^2$ to about 500 watts/cm$^2$.

39. The computer storage medium of claim 33 wherein the deposition chamber is maintained at a pressure between about 1 torr to about 500 torr.

40. The computer storage medium of claim 33 wherein the organosilane compound is provided to the deposition chamber at a flow rate in a range of about 50 sccm to about 1000 sccm.

41. The computer storage medium of claim 33 wherein the oxygen-containing gas is provided to the deposition chamber at a flow rate in a range of about 10 sccm to about 1000 sccm.

42. The computer storage medium of claim 33 wherein the ratio of the oxygen-containing gas to the organosilane compound is about 1:1 to about 1:5.

43. The computer storage medium of claim 33 wherein the deposition chamber is maintained at a temperature between about 50° C. to about 500° C.

44. The computer storage medium of claim 33 wherein the organosilicate layer is formed on the substrate at a rate greater than a bout 0.1 microns per minute.

45. The computer storage medium of claim 33 further comprising the step of annealing the organosilicate layer formed on the substrate.

46. The computer storage medium of claim 45 wherein the annealing step is performed at a temperature between about 200° C. to about 500° C.

47. The computer storage medium of claim 45 wherein the annealing step is performed in an atmosphere comprising one or more gases selected from the group of nitrogen ($N_2$), hydrogen ($H_2$), and oxygen ($O_2$).

48. The computer storage medium of claim 45 wherein the annealing step is performed a time for less than about 30 minutes.

49. A method of forming a device, comprising:
  providing a substrate having conductive features formed thereon; and
  forming an organosilicate layer over the conductive features, wherein the organosilicate layer is formed by applying an electric field to a gas mixture comprising an organosilane compound and an oxygen-containing gas.

50. The method of claim 49 wherein the conductive features are formed of one or more materials selected from the group consisting of copper, aluminum, tungsten, and combinations thereof.

51. The method of claim 49 wherein the organosilane compound has a general formula $Si_aC_bH_cO_d$ where a has a range between 1 and 2, b has a range between 1 and 10, c has a range between 6 and 30, and d has a range between 0 and 6.

52. The method of claim 51 wherein the organosilane compound is selected from the group of methylsilane ($SiCH_6$), dimethylsilane ($SiC_2H_8$), trimethylsilane ($SiC_3H_{10}$) tetramethylsilane ($SiC_4H_{12}$), methoxysilane ($SiCH_6O$), dimethyldimethoxysilane ($SiC_4H_{12}O_2$), diethyldiethoxysilane ($SiC_8H_{18}O_2$), dimethyldiethoxysilane ($SiC_6H_{16}O_2$), diethyldimethoxysilane ($SiC_6H_{16}O_2$), hexamethyldisiloxane ($Si_2C_6H_{18}O$), bis(methylsilano)methane ($Si_2C_3H_{12}$), 1,2-bis(methylsilano) ethane ($Si_2C_4H_{14}$), and combinations thereof.

53. The method of claim 49 wherein the oxygen-containing gas is selected from the group of nitrous oxide ($N_2O$), oxygen ($O_2$), ozone ($O_3$), carbon monoxide (CO), carbon dioxide ($CO_2$), and combinations thereof.

54. The method of claim 49 wherein the electric field applied to the gas mixture is a radio frequency (RF) power.

55. The method of claim 54 wherein the RF power is within the range of about 1 watts/cm$^2$ to about 500 watts/cm$^2$.

56. The method of claim 49 wherein the organosilicate layer is formed in a deposition chamber maintained at a pressure between about 1 torr to about 500 torr.

57. The method of claim 56 wherein the organosilane compound is provided to the deposition chamber at a flow rate in a range of about 50 sccm to about 1000 sccm.

58. The method of claim 56 wherein the oxygen-containing gas is provided to the deposition chamber at a flow rate in a range of about 10 sccm to about 1000 sccm.

59. The method of claim 56 wherein the ratio of the oxygen-containing gas to the organosilane compound is about 1:1 to about 1:5.

60. The method of claim 56 wherein the deposition chamber is maintained at a temperature between about 50° C. to about 500° C.

61. The method of claim 49 wherein the organosilicate layer is formed over the conductive features at a rate greater than about 0.1 microns per minute.

62. The method of claim 49 further comprising the step of annealing the organosilicate layer formed on the substrate.

63. The method of claim 62 wherein the annealing step is performed at a temperature between about 200° C. to about 500° C.

64. The method of claim 62 wherein the annealing step is performed in an atmosphere comprising one or more gases selected from the group of nitrogen ($N_2$), hydrogen ($H_2$), and oxygen ($O_2$).

65. The method of claim 63 wherein the annealing step is performed for a time less than about 30 minutes.

66. A method of fabricating a damascene structure, comprising forming a first dielectric layer on a substrate;

forming an organosilicate layer on the first dielectric layer, wherein the organosilicate layer is formed by applying an electric field to a gas mixture comprising an organosilane compound and an oxygen-containing gas;

patterning the organosilicate layer to define contacts/vias therethrough;

forming a second dielectric layer on the patterned organosilicate layer;

patterning the second dielectric layer to define interconnects therethrough, wherein the interconnects are positioned over the contacts/vias defined in the organosilicate layer;

etching the first dielectric layer to form contacts/vias therethrough; and filling the contacts/vias and the interconnects with a conductive material.

67. The method of claim 66 wherein the first dielectric layer and the second dielectric layer are each selected from the group consisting of amorphous carbon, fluorinated amorphous carbon, parylene, fluorinated silicate glass (FSG), $AF_4$, BCB, silicon carbide, oxynitride, and combinations thereof.

68. The method of claim 66 wherein the conductive material filling the contacts/vias and interconnects is selected from the group consisting of copper, aluminum, tungsten, and combinations thereof.

69. The method of claim 66 wherein the organosilane compound has a general formula $Si_aC_bH_cO_d$ where a has a range between 1 and 2, b has a range between 1 and 10, c has a range between 6 and 30, and d has a range between 0 and 6.

70. The method of claim 69 wherein the organosilane compound is selected from the group of methylsilane ($SiCH_6$), dimethylsilane ($SiC_2H_8$), trimethylsilane ($SiC_3H_{10}$), tetramethylsilane ($SiC_4H_{12}$), methoxysilane ($SiCH_6O$), dimethyldimethoxysilane ($SiC_4H_{12}O_2$), diethyldiethoxysilane ($SiC_8H_{18}O_2$), dimethyldiethoxysilane ($SiC_6H_{16}O_2$), diethyldimethoxysilane ($SiC_6H_{16}O_2$), hexamethyldisiloxane ($Si_2C_6H_{18}O$), bis(methylsilano)methane ($Si_2C_3H_{12}$), 1,2-bis(methylsilano)ethane ($Si_2C_4H_{14}$), and combinations thereof.

71. The method of claim 66 wherein the oxygen-containing gas is selected from the group of nitrous oxide ($N_2O$), oxygen ($O_2$), ozone ($O_3$), carbon monoxide (CO), carbon dioxide ($CO_2$), and combinations thereof.

72. The method of claim 66 wherein the electric field applied to the gas mixture is a radio frequency (RF) power.

73. The method of claim 72 wherein the RF power is within the range of about 1 watts/$cm^2$ to about 500 watts/$cm^2$.

74. The method of claim 66 wherein the organosilicate layer is formed in a deposition chamber maintained at a pressure between about 1 torr to about 500 torr.

75. The method of claim 74 wherein the organosilane compound is provided to the deposition chamber at a flow rate in a range of about 50 sccm to about 1000 sccm.

76. The method of claim 74 wherein the oxygen-containing gas is provided to the deposition chamber at a flow rate in a range of about 10 scam to about 1000 sccm.

77. The method of claim 74 wherein the ratio of the oxygen-containing gas to the organosilane component is about 1:1 to about 1:5.

78. The method of claim 74 wherein the deposition chamber is maintained at a temperature between about 50° C. to about 500° C.

79. The method of claim 66 wherein the organosilicate layer is formed on the first dielectric layer at a rate greater than about 0.1 microns per minute.

80. The method of claim 66 further comprising the step of annealing the organosilicate layer formed on the first dielectric layer.

81. The method of claim 80 wherein the annealing step is performed at a temperature between about 200° C. to about 500° C.

82. The method of claim 80 wherein the annealing step is performed in an atmosphere comprising one or more gases selected from the group of nitrogen ($N_2$), hydrogen ($H_2$), and oxygen ($O_2$).

83. The method of claim 80 wherein the annealing step is performed for a time less than about 30 minutes.

* * * * *

UNITED STATES PATENT AND TRADEMARK OFFICE
CERTIFICATE OF CORRECTION

PATENT NO.    : 6,531,398 B1
DATED         : March 11, 2003
INVENTOR(S)   : Gaillard et al.

It is certified that error appears in the above-identified patent and that said Letters Patent is hereby corrected as shown below:

<u>Title page, Item [54] and Column 1, line 2,</u>
Please change "ORGANOSILLICATE" to -- ORGANOSILICATE --.

<u>Column 4,</u>
Line 50, please change "50 scam" to -- 50 sccm --.
Line 50, please change "1000 scam" to -- 1000 sccm --.
Line 51, please change "10 scam" to -- 10 sccm --.
Line 52, please change "scam" to -- sccm --.

<u>Column 5,</u>
Lines 10 and 11, please change "scam" to -- sccm --.

<u>Column 6,</u>
Line 10, please change "suicides" to -- silicides --.

<u>Column 12,</u>
Line 36, please change "scam" to -- sccm --.

Signed and Sealed this

Sixteenth Day of September, 2003

JAMES E. ROGAN
*Director of the United States Patent and Trademark Office*